United States Patent [19]

Schmidt et al.

[11] Patent Number: 5,729,897

[45] Date of Patent: Mar. 24, 1998

[54] METHOD OF MANUFACTURING MULTILAYER FOIL PRINTED CIRCUIT BOARDS

[75] Inventors: Walter Schmidt, Zürich; Marco Martinelli, Neftenbach, both of Sweden

[73] Assignee: Dyconex Patente A.G., Zug, Sweden

[21] Appl. No.: 397,106

[22] PCT Filed: Jun. 24, 1994

[86] PCT No.: PCT/CH94/00134

§ 371 Date: Mar. 6, 1995

§ 102(e) Date: Mar. 6, 1995

[87] PCT Pub. No.: WO95/02312

PCT Pub. Date: Jan. 19, 1995

[30] Foreign Application Priority Data

Jul. 7, 1993 [SE] Sweden .................. 2035/93
Jul. 7, 1993 [SE] Sweden .................. 2036/93

[51] Int. Cl.$^6$ .................. H05K 3/42; H05K 3/46
[52] U.S. Cl. .................. 29/852; 29/830; 29/847; 156/643.1; 174/262; 216/18; 427/97
[58] Field of Search .................. 29/852, 846, 830, 29/847; 156/643.1; 216/17, 18, 39, 67; 174/250, 261, 262; 361/784; 427/97

[56] References Cited

U.S. PATENT DOCUMENTS

| | | | |
|---|---|---|---|
| 4,277,321 | 7/1981 | Bartlett et al. | 29/852 X |
| 4,720,322 | 1/1988 | Tiffin | 156/643 |
| 4,840,093 | 6/1989 | Florgello et al. | 156/643.1 X |
| 4,985,990 | 1/1991 | Cronin et al. | 29/852 |
| 5,108,553 | 4/1992 | Foster et al. | 29/852 X |
| 5,227,013 | 7/1993 | Kumar | 216/18 |
| 5,386,627 | 2/1995 | Booth et al. | 29/852 |

FOREIGN PATENT DOCUMENTS

| | | |
|---|---|---|
| 0 275 686 | 7/1988 | European Pat. Off. . |
| WO92/15408 | 9/1992 | WIPO . |

OTHER PUBLICATIONS

Hara Koji, "Manufacture of Flexible Printed Wiring Board", Patent Abstracts of Japan, Publication No. JP3206682 dated Sep. 1991, appl. No. JP00002678 dated Jan. 1990 (Sumitomo Electric Ind. Ltd.).

*Primary Examiner*—Peter Vo
*Attorney, Agent, or Firm*—Walter C. Farley

[57] ABSTRACT

Multilayer printed circuit boards, foil printed circuit boards and metal-clad laminates for foil circuit boards and a process for the manufacture thereof, with interfacial connections structured in insulator layers, with resist openings of surface structured in resist coatings, with current paths structured in conductor layers and with contact points and in which for reducing the number of photochemical structurings or patternings required the interfacial connections and resist openings are mechanically structured, in that interfacial connection openings preworked in insulator layers are etched according to interfacial connection structures of mask foils, that in the interfacial connection openings are deposited electrically conductive deposition substances for the formation of contact layers in said openings. In the coating layers are etched resist openings according to contacting structures of mask foils, so that the resist openings form resist material-free areas on the circuit boards, foil circuit boards and metalclad laminates for foil circuit boards and the resist openings are worked in freely shaped manner and have circular cylindrical, circular, oval, square, rectangular or polygonal diameters.

24 Claims, 13 Drawing Sheets

METHOD OF MANUFACTURING MULTILAYER FOIL PRINTED CIRCUIT BOARDS

FIELD OF THE INVENTION

The invention is in the field of the manufacture of printed circuit boards and relates to circuit boards, foil circuit boards and metal-clad laminates for foil circuit boards with structured or patterned coverings and with plasma-etched interfacial connections and it relates to a photochemical method for the manufacture thereof.

BACKGROUND OF THE INVENTION

In the manufacture of thin, multilayer foil printed circuit boards constituted by insulator layers and conductor layers, hitherto a large number of separate structuring or patterning operations have been carried out by photochemical processes. Thus, for the structuring of interfacial connections in insulator layers firstly prepared interfacial connections are structured, whereby subsequently at the position thereof the interfacial connections are plasma-etched and plated on. However, current paths and pads are directly photochemically structured in electrically conductive layers. Finally, the photochemical structuring of the covering takes place in subsequently applied, protective resist coatings on surfaces of foil circuit boards.

Such structuring or patterning operations take place according to known, proven photochemical processes, which are widely used in electrical engineering. They are used successively and as multistage production processes suffer from the main disadvantages indicated hereinafter.

The more structurings are required, the more expensive the manufacture. For each of these structurings photomasks must be produced and accurately positioned. In addition, photoresist coatings must be applied to the intermediate product for producing foil circuit boards and then removed again.

The more structurings are required, the lower the efficiency or yield. The total yield of several sequentially performed production processes is formed from the product of the individual yields and the wastage of each process limits the yield of all the following processes.

The more structurings required, the greater the additional manufacturing costs. The potential physical and electronic possibilities of the photochemical processes used are consequently restricted by the large number of structurings performed. The restrictions are given below.

The manufacturing tolerances have a restricting effect. Thin, multilayer foil circuit boards with thicknesses below 100 µm and interfacial connections with a diameter below 100 µm must, in the case of several exposures with different photomasks, have certain manufacturing tolerances for all these structurings, which rapidly reach the order of magnitude of the structures.

The thicknesses of the current paths and the interfacial connections are restrictive. Following a structuring of the preworked interfacial connections, they are plasma-etched and plated on galvanically, e.g. with copper. The resulting interfacial connections deteriorate the dimensional stability of the overall foil circuit board, because electrodeposited metal coatings are not stress-free. The galvanic plating on also leads to an increase in the thickness of the top metal foil of the foil circuit board. The thicker the metal coating, the more difficult it is to chemically etch it. The physical advantage of very small dimensions on film circuit boards is limited in this way, as is the electronic advantage of thin current paths.

Finally, the photochemical structurings of coverings on circuit boards and foil circuit boards are restrictive. For producing very fine structurings in resist coatings with sharply contoured edges advantageously application takes place of photosensitive solder resists or photosensitive solder resist foils. The solder resist can be applied by means of various methods such as printing on, rolling on, pouring on, electrostatic spraying, electrophoretic deposition, etc. and is predried. The solder resist foil is laminated on by means of a vacuum coater. The structures in these coverings are transferred by means of a photomask having a high pattern definition of 20 µm. The high installation costs for the necessary machines, ovens, etc. are disadvantageous, as are the high process costs resulting from the limited environmental compatibility thereof (use of wet chemistry and waste water treatment, etc.). In addition, the solder resist is brittle and therefore difficult to use for flexible circuit carriers such as foil circuit boards, because it can chip off when the board is bent.

SUMMARY OF THE INVENTION

It is desirable to have a photochemical process for the manufacture of printed circuit boards, foil printed circuit boards and for metal-clad laminates for foil circuit boards with structured coverings and with plasma-etched interfacial connections, which reduces the above-described disadvantages of multiple structurings or patternings. Such a process must be favourable from the cost standpoint, lead to limited wastage, permit a high pattern definition and dimensional stability and must be flexible with regards to the shaping of such structures in the conductor layers, in the insulator layers and in the resist coatings. In addition, it must be possible to use known, proven methods, materials, etc. The process must also be compatible with known processes with regards to the further processing and in the case of varying dimensions of the components to be loaded. In particular, the number of photochemical structurings needed is to be reduced.

Such circuit boards, foil circuit boards and metal-clad laminates for foil circuit boards with structured coverings and plasmaetched interfacial connections are manufactured according to the invention defined in the claims.

The invention is based on the fact that plasma-etched structures in insulator layers can be made not only with known "chemical" masks (structured photoresist), but also with "mechanical" masks (structured, plasma etching-resistant foil, preferably made from conductor material) in a simultaneous manner and with a high definition of below 100 µm. Therefore reference is also made to "mechanical structurings" of insulator layers and cover layers.

In the process according to the invention current paths and pads are photochemically structured or patterned in the conductor layers with the aid of photoresists. Preworked interfacial connections in insulator layers and coverings in cover layers are mechanically structured with the aid of mask foils. This leads to a desired reduction in the number of photochemical structurings required.

Advantageously the insulator layers and cover layers are polyimide films and the structured mask foils are steel or copper foils. The steel or copper foils can be remmovably and non-removably positioned on the polyimide films to be etched. In other words the mask films can be firmly connected to foil circuit boards, so that polyimide films are plasma-etched in accordance with the structures of the copper foils. The copper can then be integrated into the manufacturing process for the circuit boards, foil circuit

3 boards and metal-clad laminates for foil circuit boards and e.g. structured in current paths. Thus, mask foils can be connected to foil circuit boards only for plasma etching and for example, by using clips. Therefore steel foils are only temporarily fixed to foil circuit boards and are subsequently removed and therefore constitute reutilizable resources.

Detachable mask foils are applied to the insulator layers in such a way that the positions of the interfacial connections in the mask foils coincide with the positions of the interfacial connections or coverings to be produced. By tight pressing together of the mask foils, foil packages are formed, so that in a plasma etching process interfacial connection openings and/or resist boundaries can be etched according to the through openings of the mask foils in the insulator and/or resist layers. The mask foils can be removed immediately afterwards and then replaced in further manufacturing processes for example by other mask foils for other mechanical structurings and then in yet further manufacturing processes for example by photoresists for photochemical structurings.

BRIEF DESCRIPTION OF THE DRAWINGS

The invention is described in greater detail hereinafter relative to the attached FIGS. 1 to 37, wherein show:

FIG. 26 An embodiment of local weak points in the peeloff area of mask foils from the intermediate products.

FIG. 27 Another embodiment of local weak points in the peeloff area of the mask foils from the intermediate products.

DESCRIPTION OF THE PREFERRED EMBODIMENTS

FIGS. 1 to 8 show a variant of the process according to the invention for the photochemical structuring or patterning of current paths and pads on part of an intermediate product and the mechanical structuring or patterning of interfacial connections according to mask foils. The intermediate product and the process steps are represented in said drawings in a section along the flat extension of the intermediate product. The interfacial connections to be made are intended to interconnect at least two electrically conductive layers or conductor layers separated from one another by a plastic or insulator layer.

4

Thus, the interfacial connections alternately penetrate intermediate insulator layers arranged between conductor layers and in each case connect at least two such conductor layers. The interfacial connections need not be perpendicular to the surface of the plastic layer to be traversed and can also pass in inclined manner therethrough. For the process according to the invention there is no need to structure pads in the conductor layers.

Figure 1:
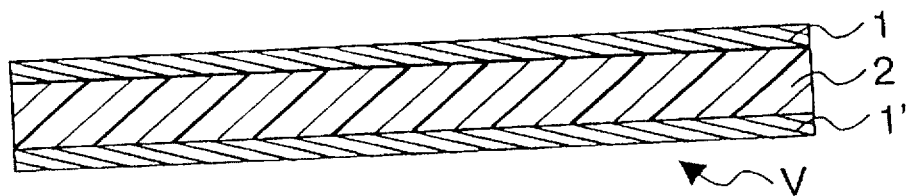
FIGS. 1 to 8 A variant of the process according to the invention for the photochemical structuring or patterning of current paths and pads on part of an intermediate product and the mechanical structuring or patterning of interfacial connections with mask foils.

FIG. 1 shows an intermediate product V of the process. Advantageously use is made of a multilayer intermediate product V, which e.g. comprises an insulator layer of plastic film 2 lined on both sides with electrically conductive layers or conductor layers 1, 1'. The conductor layers 1, 1' can be copper foils and the insulator layers 2 can be suitable plastics films, for example polyimide or epoxy films. In place of the copper foils it is also possible to use cold laminated composite foils comprising a thicker aluminum foil and thinner copper foils laminated onto both sides thereof. Other suitable starting products are e.g. foils made from stainless steel, brass, bronze, aluminum-magnesium alloys, invar, molybdenum, etc.. These conductor layers 1, 1' and the plastic film 2 are 3 to 100 µm thick. The intermediate product V can be rigid or flexible.

Figure 2:
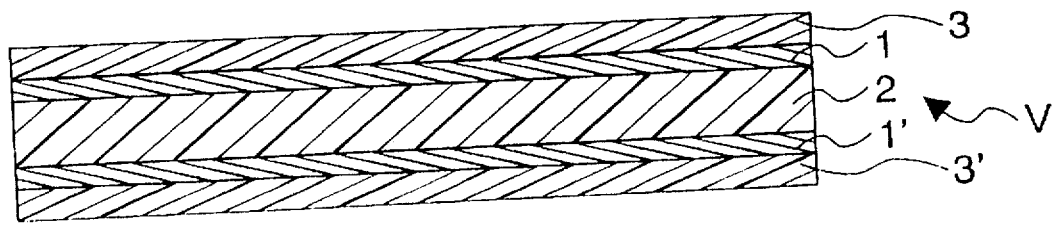

FIG. 2 shows how the intermediate product V according to FIG. 1 can be coated on both sides with photoresist 3, 3'. The conductor layers 1, 1' are completely covered with photoresist 3, 3'. It is possible to use a solid or liquid photoresist. The photoresist layers 3, 3' can be exposed in known photochemical processes, so that conductive patterns and interfacial connection structures are transferred via a photomask.

Figure 3:
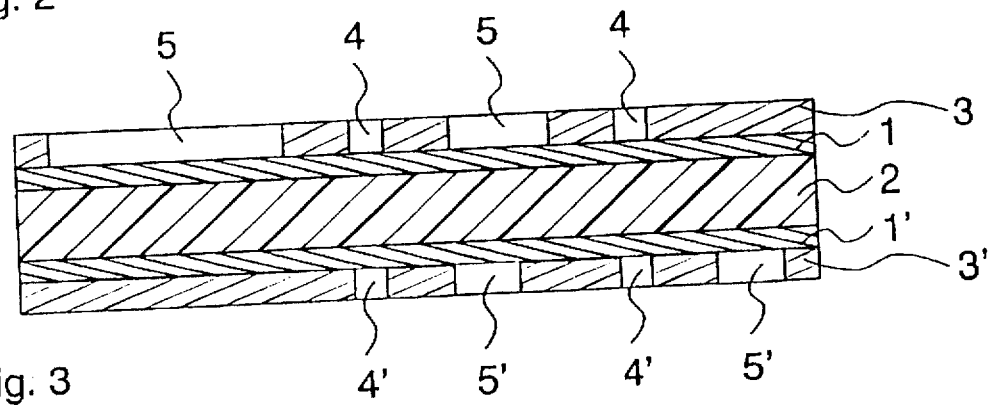

FIG. 3 shows this photochemically performed structuring of the photoresist layers 3, 3'. In the structured photoresist layer 3 are provided conductive patterns 5 and interfacial connection structures 4 and in the structured photoresist layer 3' conductive patterns 5' and interfacial connection structures 4'. These structures extend down to the conductor layers 1, 1'. The diameter of the interfacial connection structures 4, 4' is typically 25 to 100 µm. These structures 4, 4', 5, 5' are freely selectable and can have circular cylindrical, round, oval, square, rectangular or polygonal diameters. The conductive pattern structures 5, 5' and the interfacial connection structures 4, 4' are used for the transfer of the circuit design (current paths, pads, etc.) and the informations concerning the position and structure of the interfacial connections to be produced into the conductor layers 1, 1'. In the areas 3, 3' where photoresist remains, no electrically conductive material of the conductor layers 1, 1' will be removed during the following process steps.

Figure 4:
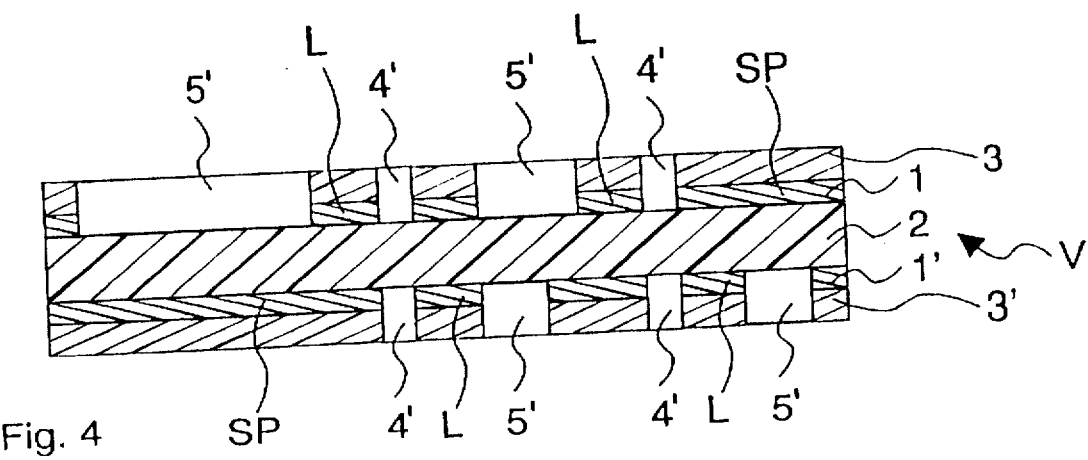

FIG. 4 shows the thus photochemically structured intermediate product V after wet chemically etching the material of the conductor layers 1, 1' not covered by the photoresist 3, 3'. This etching leads to the planned removal of individual areas of the conductor layers 1, 1', so that current paths SP, pads L and preworked interfacial connection openings 4' separated by insulating areas 5' are formed. The wet chemical etching takes place in planned manner in the depth, i.e. the conductor layers 1, 1' are removed down to the plastic film 2 in the areas not covered by the photoresist 3, 3'. The wet chemical etching takes place simultaneously in all the exposed areas (i.e., the areas which are accessible to the etching chemicals and liquids).

Figure 5:
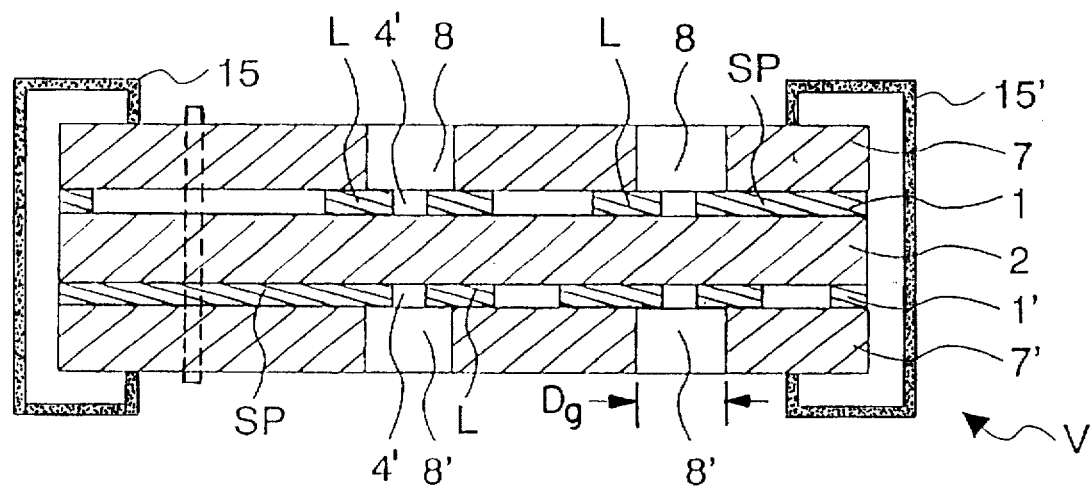

FIG. 5 shows the intermediate product V in the production stage according to FIG. 4 after removing or stripping the photoresist layers 3, 3', which takes place by means of known, proven chemical processes. Two thin mask foils 7, 7', e.g. stainless steel foils having a thickness below 100 μm are removably fitted to the structured conductor layers 1, 1'. They are fixed by means of clips 15, 15' and can be removed by the detachment of the latter. Fixing is constituted by tight pressing. The positioning of the mask foils 7, 7' takes place in known manner, e.g. by registering bolts 18 which pass through openings provided for them. Thus, to the intermediate product V and the mask foils 7, 7' are applied specially shaped markings, which are for example made to coincide with one another, so that there is a controlled positioning thereof.

The mask foils 7, 7' are structured by contour etching and have through openings 8, 8', which are aligned with the interfacial connection openings 4' of the conductor layers 1, 1'. The external diameters of the through openings 8, 8' are larger than the external diameter of the preworked interfacial connection openings 4' of the conductor layers 1, L', but smaller than the external diameter of the pads L fitted around the preworked openings 4'. The contour etching of the through openings 8, 8' takes place in a separate, not shown, known production process. It is possible to use various shapes and structures, such as round and angular openings, elongated straight and curved openings, etc. The through openings 8, 8' are made larger than the preworked interfacial connection openings 4', in order to compensate for any dimensional changes of the plastic film 2. It is advantageous to use through openings with a most favorable external diameter Dg for the optimum dimensioning in the case of minimum space consumption. This is calculated from the external diameter of the pads L, minus the external diameter of the preworked interfacial connection openings 4', divided by two.

The tight pressing of the mask foils 7, 7' onto the intermediate product V is made easier by the fact that the foils 7, 7' are slightly concave, so that at the edges thereof they bend away slightly to the outside from the flat extension of the intermediate product V, so that as a result of fixing by means of clips 15, 15' bending forces are generated, ensuring a shaking-free and displacement-free engagement of the mask foils 7, 7' on the intermediate product V for the formation of foil packages. This is important, because the thus formed foil packages must be transported, e.g. for plasma etching, into and out of the plasma reactor.

Figure 6:
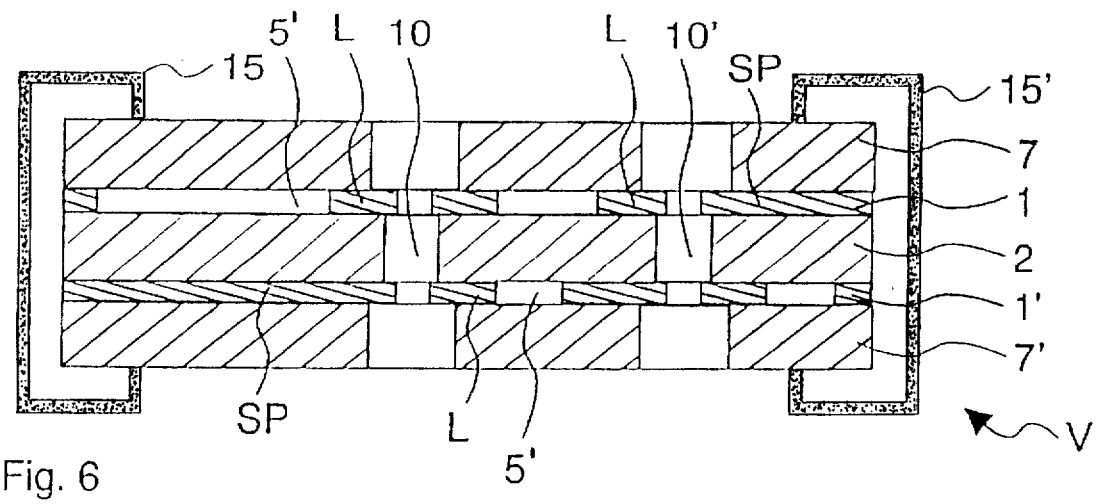

FIG. 6 shows a foil package according to FIG. 5 following the plasma etching of interfacial connection openings 10 in the plastic film 2. The openings 10 are etched at the position of the through openings 8, 8' of the mask film 7, 7'. The interfacial connection openings 10 are deliberately back-etched, i.e. they are etched along the flat extension of the intermediate product V under the edges of the conductor layers 1, 1' e.g. structured in the pads L or current paths SP. Other areas of exposed plastic film 2, such as the insulating areas 5', are protected against plasma action by the mask foils 7, 7'.

Figure 7:
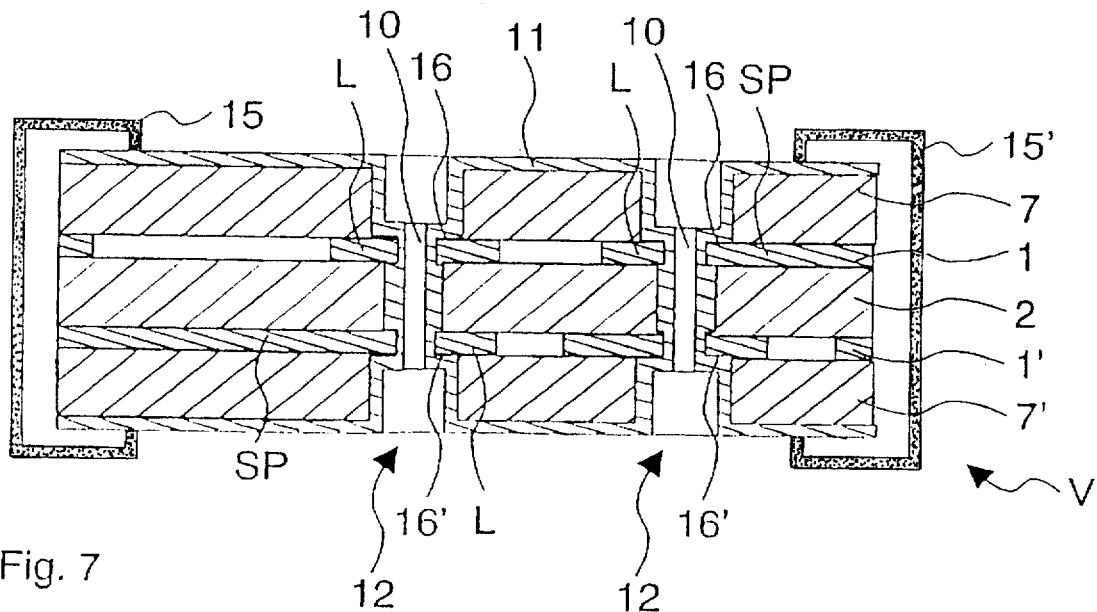

FIG. 7 shows a plasma-etched foil package according to FIG. 6 following the plating on of a contact layer 11 made from electrically conductive material, e.g. copper. In this known, proven chemical and galvanic process the mask foils 7, 7' and interfacial connection openings 10 of the intermediate product V are coated with a contact layer 11 in such a way that the openings 10 are plated-through. The electrically conductive material is electrochemically deposited and plated on. The plated-through openings 10 are referred to as interfacial connections 12. The deposited contact layer 11 is thin and has thicknesses below 25 μm. The interfacial connections 12 have via connecting areas 16, 16' electrical contact with pads L, current paths SP and mask foils 7, 7'.

After removal of the mask foils 7, 7' an embodiment of a two-layer foil circuit board according to the invention is obtained.

Figure 8:
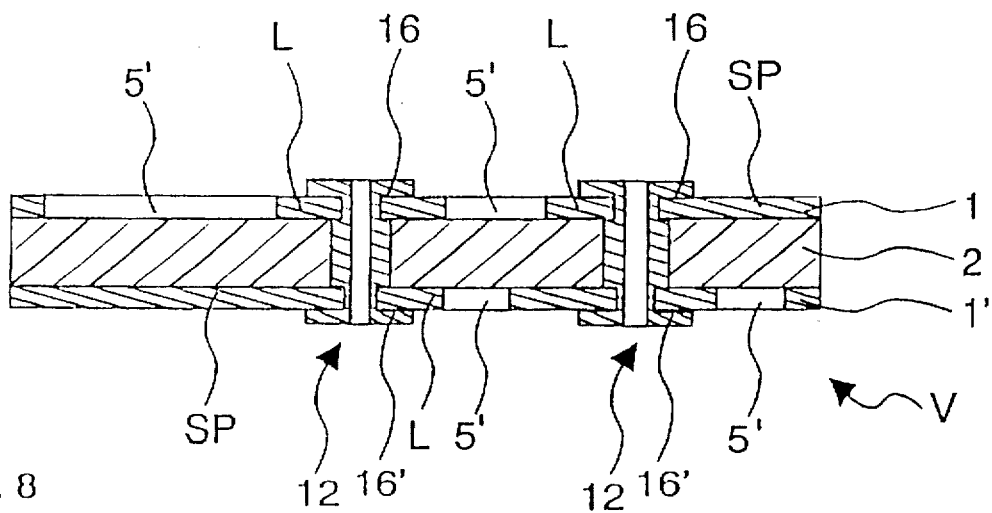

FIG. 8 shows the two-layer foil circuit board according to FIG. 7 after removing the mask foils 7, 7'. There is no problem in removing the mask foils 7, 7' in the case of the thin, plated on contact layers 11 with thicknesses below 10 μm and drawing off is possible after detaching the clips 15, 15'. For the manufacture of foil circuit boards with more than two conductor layers 1, 1', e.g. such a two-layer foil circuit board is provided with further insulator and conductor layers and is photochemically and mechanically structured by repeating the inventive method in a first embodiment according to FIGS. 1 to 8. The two-layer foil circuit board provided with the insulator and conductor layers then once again constitutes an intermediate product V. Structuring always takes place of those areas of the intermediate product V which are accessible from the outside to liquids, chemicals and light and on which the mask foils can be positioned. Numerous variants are available to the expert with the knowledge of the present invention.

The thickness of the contact layers 11 is a critical parameter. With thicker contact layers 11 there can be uncontrolled separation of the mask foils 7, 7' from the intermediate product V in the connecting area 16, 16'. This can lead to tearing off or breaking of areas of plated on contact layers 11 and e.g. to damage to the interfacial connections 12 by interrupting electrical contacts to the pads L or current paths SP. Such undesired breaks due to strongly plated on connections between the intermediate product V and the mask foils 7, 7' are avoided in further variants of the process according to the invention with respect to FIGS. 9 to 27.

The mask foils 7, 7' are reutilizable resources, because, after removing the plated on contact layer 11, they can be reused. In advantageous embodiments the mask foils 7, 7' are polished metal foils, from which the plated on contact layer 11 can be removed again by stripping. The removal of the contact layer 11 from the mask foils 7, 7' can also take place by chemical etching.

If any impurities, e.g. dust remain between the intermediate product V and the mask foils 7, 7' after the fixing together thereof, then in such areas the mask foils 7, 7' may not rest flat on the intermediate product V and small cavities can form between them. Such cavities can be accessible during plasma etching or also during plating on for the etching medium and respectively chemicals and liquids, which is not prejudicial or can be removed in simple manner. Firstly the etching rate in the narrow cavities is virtually zero, because only small amounts of etching medium can penetrate them. Secondly the penetration of chemicals and liquids into such cavities during plating on can be avoided by prior filling thereof with a harmless liquid, such as e.g. water.

FIGS. 9 to 17 show a further variant of the process according to the invention for the photochemical structuring or patterning of current paths and pads on part of an intermediate product and mechanical structuring or patterning of interfacial connections. The intermediate product and process steps are shown in these drawings in a section along the flat extension of the intermediate product. The process sequence for this variant largely coincides with that described relative to FIGS. 1 to 8, so that reference will only be made hereinafter to the differences.

The main difference between the first and second variants of the process according to the invention is that in the second variant the photoresist 3, 3' is not stripped prior to the application of the mask foils 7, 7' and is instead left on the intermediate product V. The process steps according to FIGS. 9 to 12 are consequently identical with those of FIGS. 1 to 4.

Figure 13:
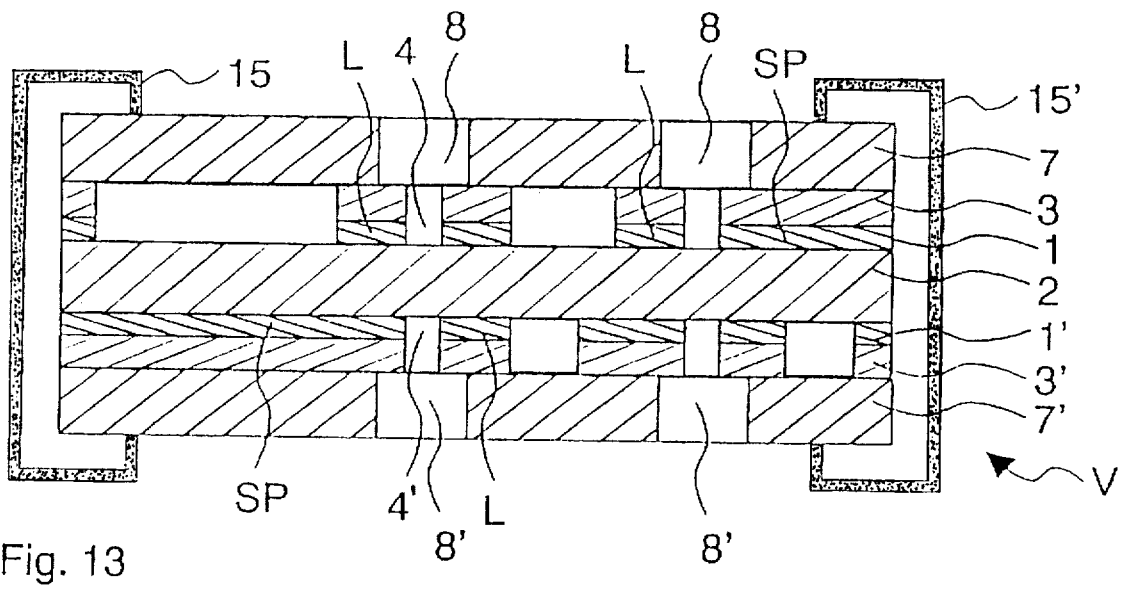

FIG. 13 shows the intermediate product V in the manufacturing stage according to FIG. 4 and where two thin mask foils 7, 7' have been reversibly fitted in a direct manner to the photoresist 3, 3' by means of clips 15, 15'. The mask foils 7, 7' have through openings 8, 8', with which the preworked interfacial connection openings 10 can be made to coincide and have a larger diameter than the latter.

Figure 15:
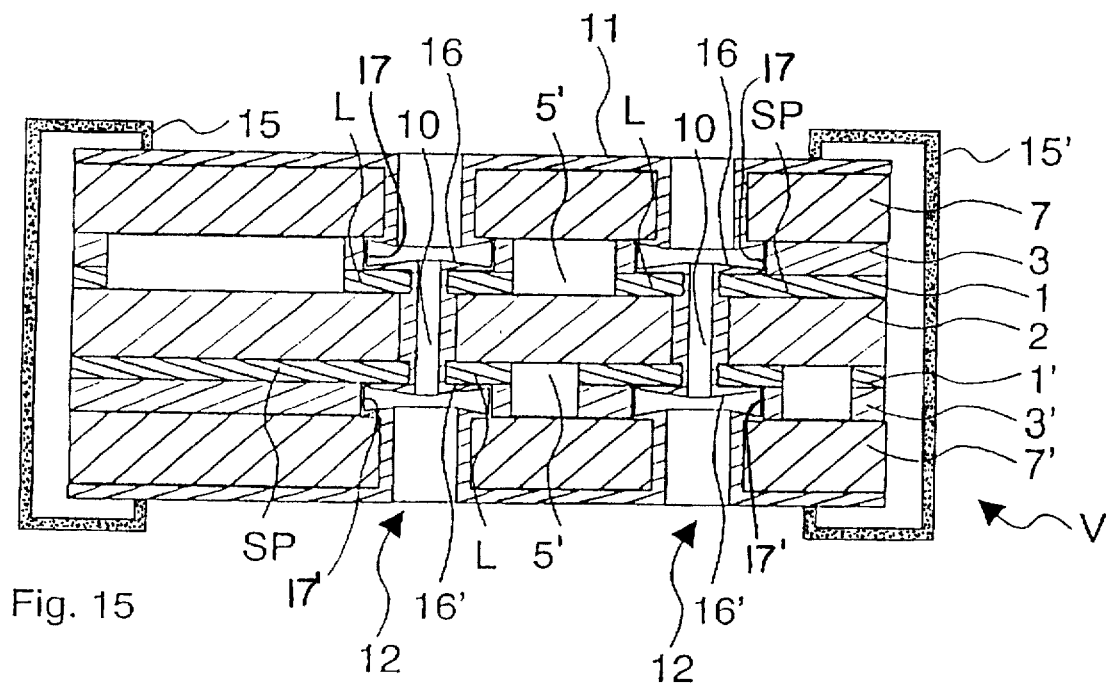
FIGS. 9 to 17 Another variant of the process according to the invention of photochemically structuring current paths and pads on a part of an intermediate product and the mechanical structuring of interfacial connections by means of mask foils.
Figure 9:
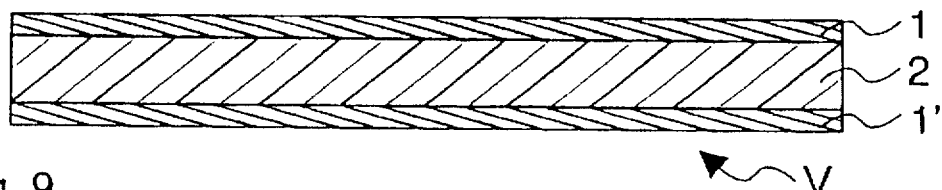
Figure 10:
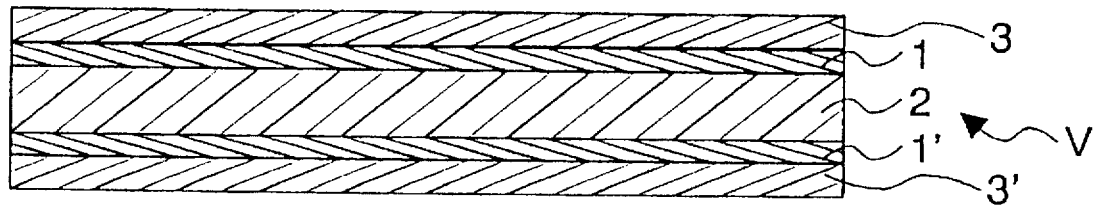
Figure 11:
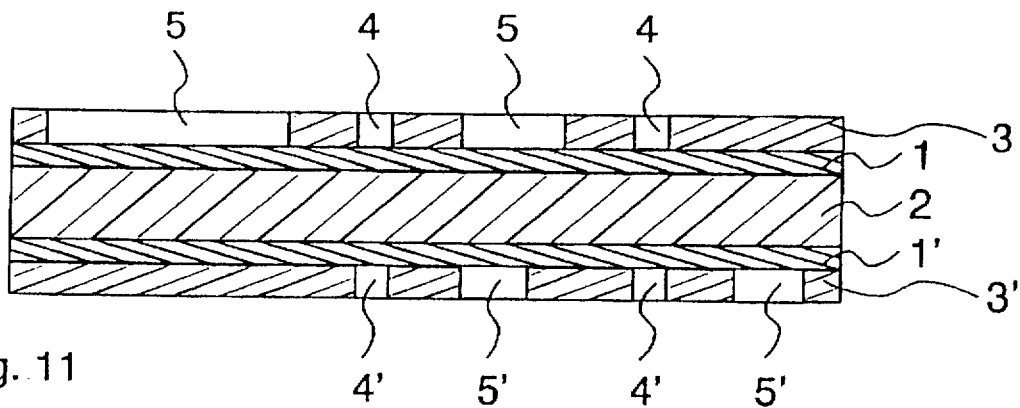
Figure 12:
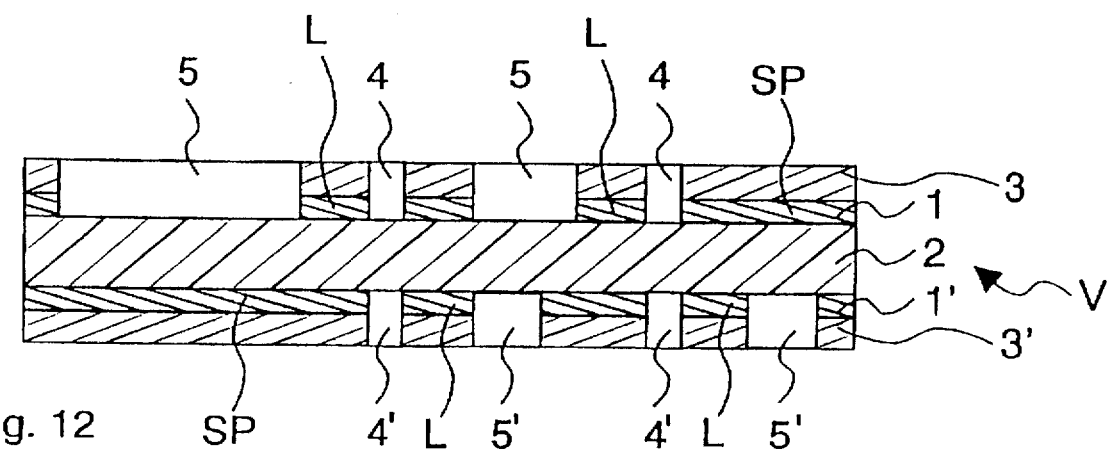
Figure 14:
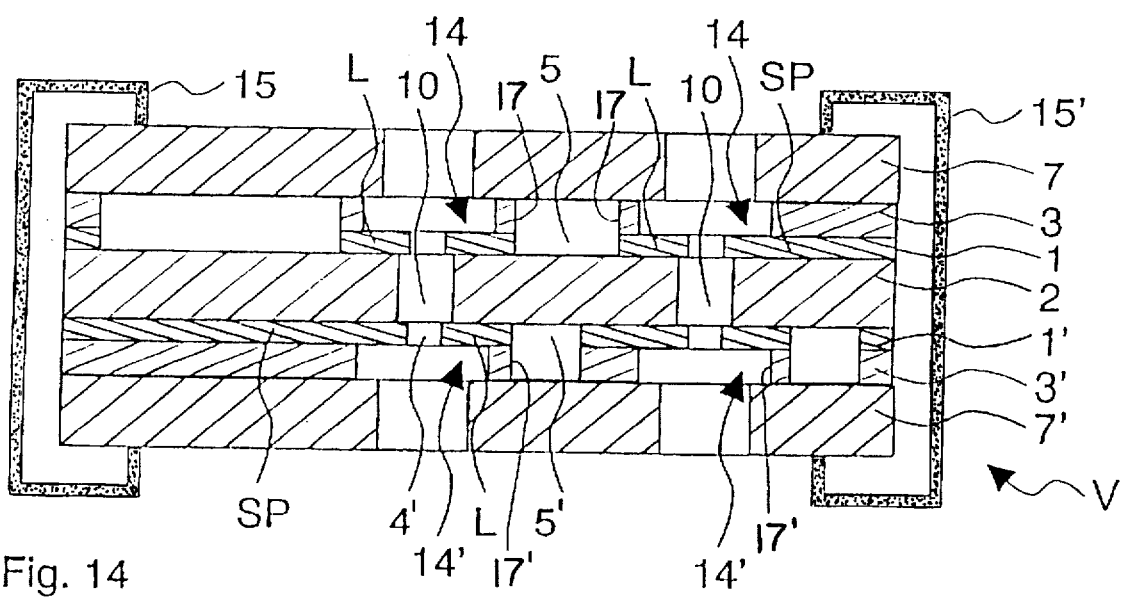

FIGS. 14 and 15 show process steps of the plasma etching and the plating on of the further variant, which largely coincide with the corresponding process steps of the variant according to FIGS. 6 and 7. During plasma etching the interfacial connection openings 10 are etched and the exposed photoresist 3, 3' back-etched. These back-etched areas 14, 14' form local weak points 17, 17' of the plated on contact layer 11 in the peel-off areas between the intermediate product V and the mask foils 7, 7'. The backetchings in the photoresist 3, 3' are plated on in local planned manner, which on the one hand leads to good, strong, stable connection areas 16, 16' of the interfacial connections 12 with the pads and the current paths SP and on the other local weak points 17, 17' of the interfacial connections 12 with the mask foils 7, 7' are obtained, so that the latter can be removed, even when applying thicker contact layers 11 with thickness greater than 10 µm in the vicinity of the interfacial connections 12 without damage to the intermediate product V. This first embodiment of local weak points 17, 17' is described in greater detail relative to FIG. 26.

Figure 16:
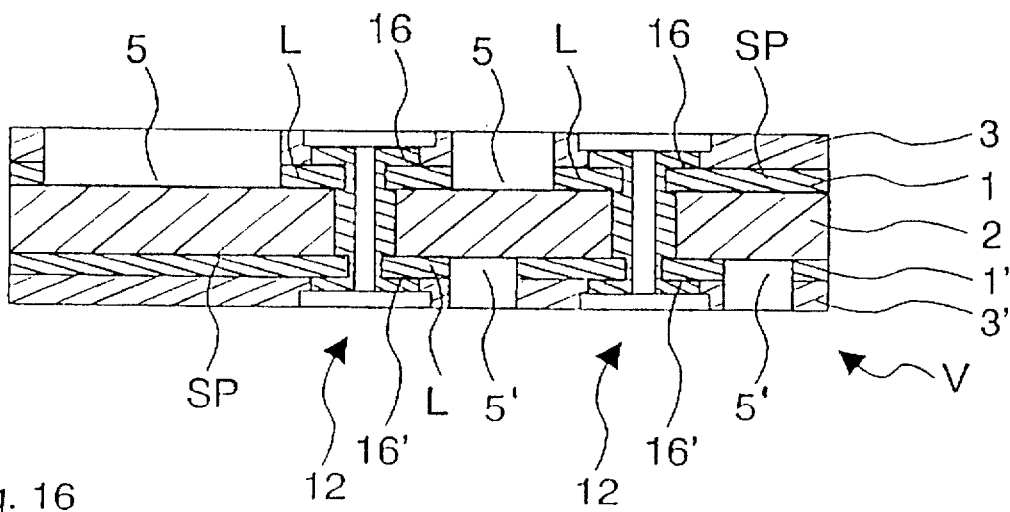
Figure 17:
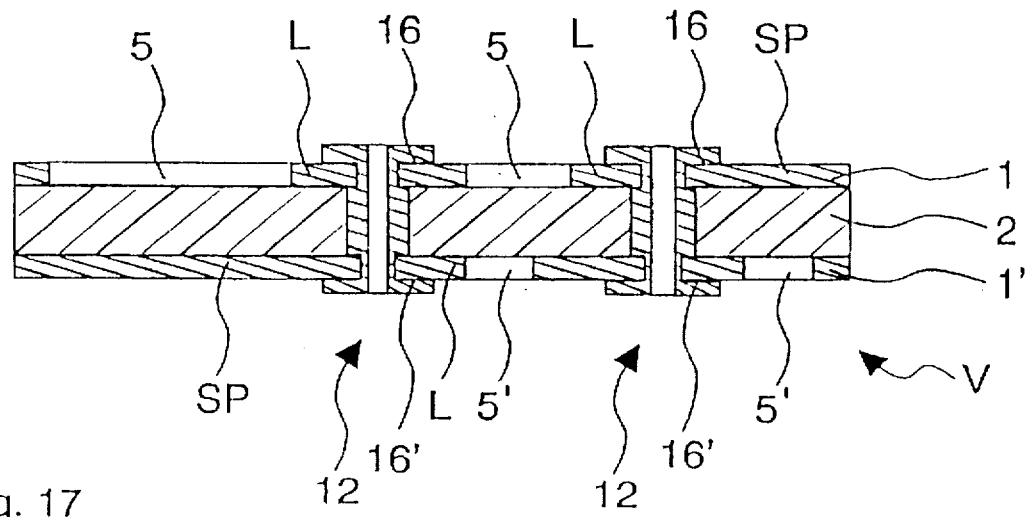
Figure 22:
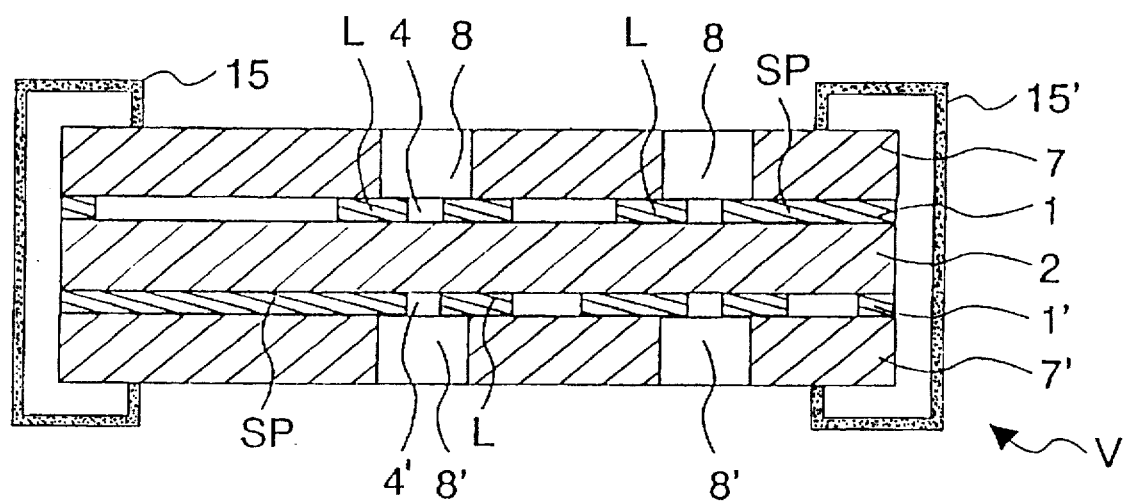
Figure 18:
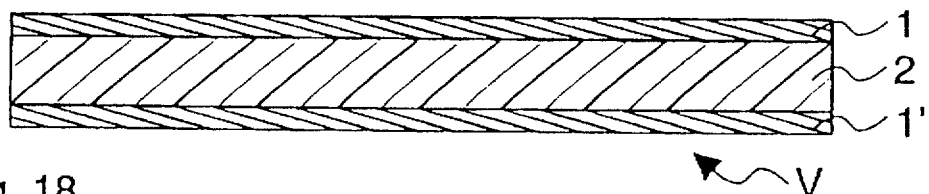
Figure 19:
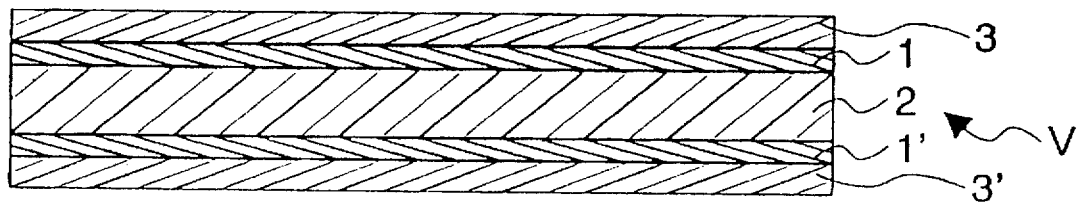
Figure 20:
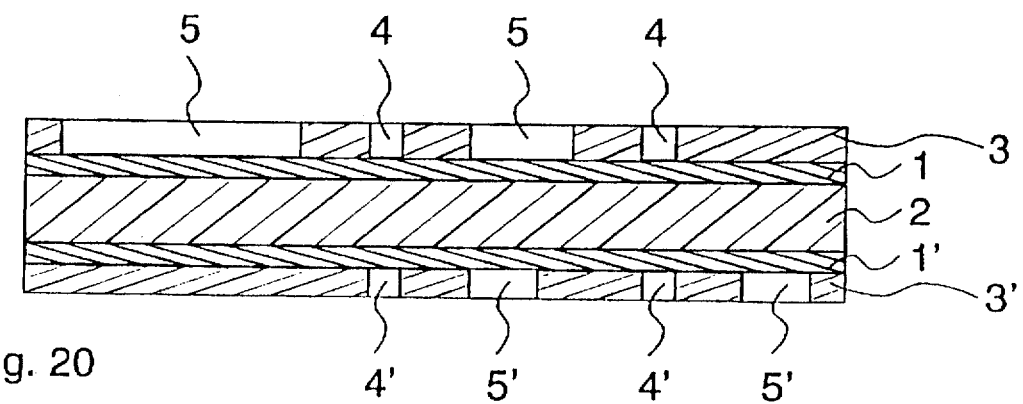
Figure 21:
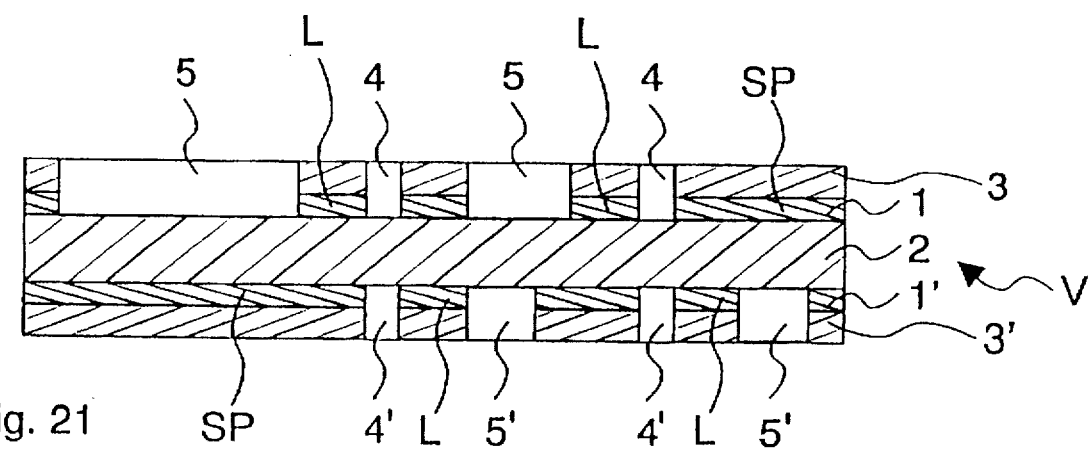

FIGS. 16 and 17 show the intermediate product V after the removal of the mask foils 7, 7' by releasing the clips 15, 15' and removing the mask foils 7, 7' (cf. FIG. 16) and after the conventional stripping of the remaining photoresist 3, 3' (cf. FIG. 17). FIGS. 18 to 25 show a further variant of the process according to the invention for the photochemical structuring or patterning of current paths and pads on part of an intermediate product and the mechanical structuring or patterning of interfacial connections with mask foils. The intermediate product and the process steps are shown in a section along the flat extension of the intermediate product. The process sequence of this third variant largely follows that of the variants described relative to FIGS. 1 to 8 and FIGS. 9 to 15, so that hereinafter only differences are explained.

The main difference compared with the variant of FIGS. 1 to 8 is that in the third variant deposition takes place of an electrically conductive deposition substance, e.g. a metal such as nickel or gold, as a result of chemical potential differences. The process steps according to FIGS. 18 to 23 are identical with those of FIGS. 1 to 6.

Figure 23:
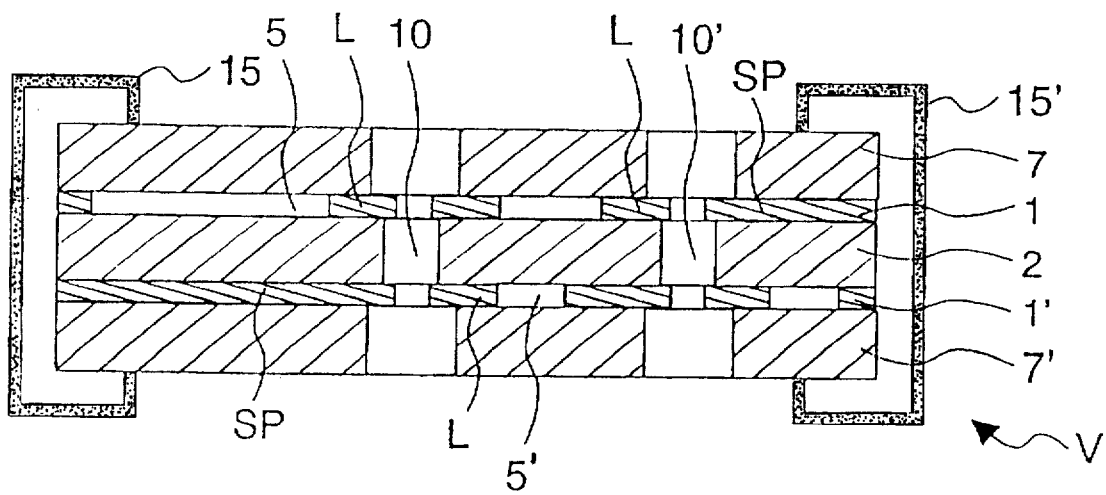
FIGS. 18 to 25 Another variant of the process according to the invention of photochemically structuring current paths and pads on part of an intermediate product and the mechanical structuring of interfacial connections by means of mask foils.
Figure 24:
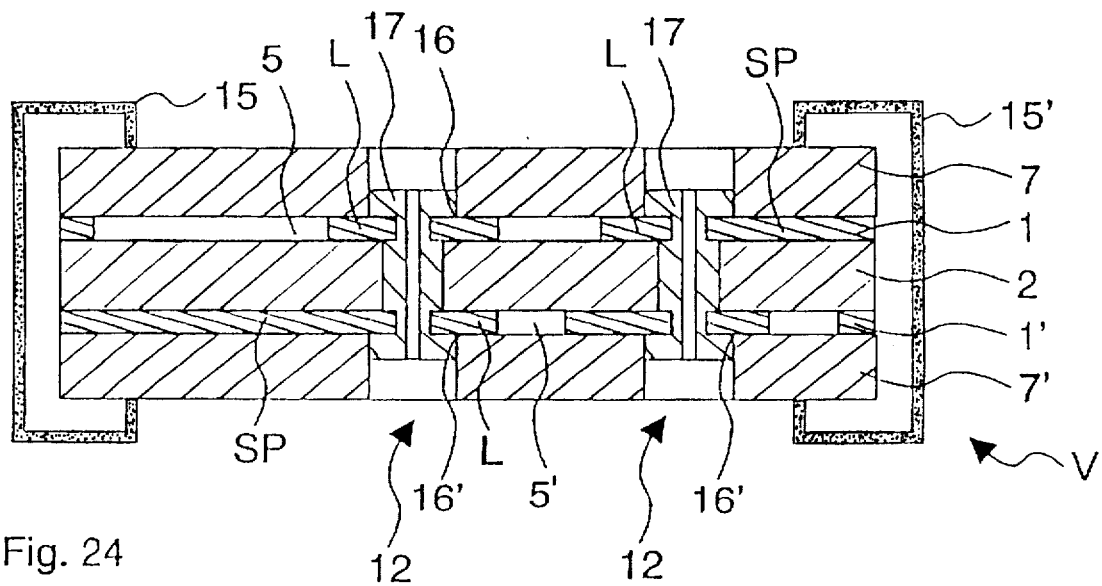

FIG. 24 shows the foil package with interfacial connections 12 in the manufacturing stage according to FIGS. 23 or 6. The difference of the chemical potential between the participating conductive materials is deliberately utilized in order to only cover the interfacial connection openings 10 in the vicinity of the current paths SP and pads L, as well as the plastic film 2 with a contact layer, so as in this way to produce interfacial connections 12. If e.g. the current paths SP and pads L were structured from copper foils, then it would be possible to chemically deposit on the intermediate product V in a nickel or gold bath a thin nickel or gold coating. This is utilized in the process according to the invention in order to form interfacial connections 12 in the interfacial connection openings 10 and which are electrically contactable via connecting areas 16, 16' with current paths SP and pads L, without there being strong connections to the mask foils 7, 7'.

This is brought about by a local, planned deposition of metal. This process is controllable as a result of the chemical potential differences between the materials used. If the mask foils 7, 7' are e.g. stainless steel foils and the deposition substances are metal such as nickel or gold, then on the stainless steel foils are deposited a very small amount of nickel or gold with a thickness of a few µm, so that no strong connections are formed between the intermediate product V and the stainless steel foils and consequently there is no damage to the product V on removing the stainless steel foils. If the mask foils 7, 7' are formed by gilded, stainless steel foils, when using nickel as the deposition substance, as a result of its favorable chemical potential difference, no nickel is deposited thereon. Nickel or gold can be very well deposited on copper and in the case of corresponding activation can also be chemically deposited on the plastic film 2. In this way foil circuit boards can be manufactured with plasma-etched interfacial connections 12 with diameters smaller than 100 µm from deposited contact layers 11 thinner than 25 µm.

Figure 25:
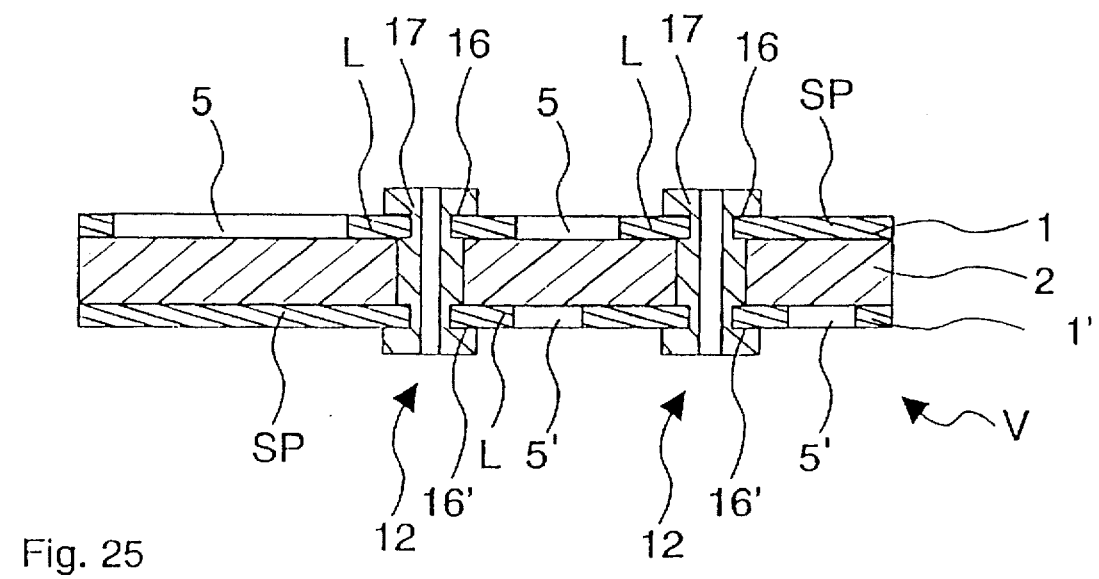

FIG. 25 shows the intermediate product V following the removal of the mask foils 7, 7' by detaching the clips 15, 15' and stripping the mask foils 7, 7'. As the connections between the intermediate product V and the mask foils 7, 7' are very thin (smaller than 10 µm) or do not exist, no damage is caused here to the product V by breaks in the connecting areas 16, 16'.

FIGS. 26 and 27 show two embodiments of local weak points 17, 17' in the peel-off area of the intermediate product V from the mask foils 7, 7'. It is only possible to see part of the intermediate product V following the process steps of plasma etching the through openings 10 and depositing electrically conductive contact layers 11.

The embodiments of local weak points 17, 17' in the peel-off area in FIG. 26 shows a detailed enlargement of the variant of the process according to the invention described relative to FIGS. 9 to 17, where the photoresist 3, 3' is not removed or stripped after the structuring of the conductive patterns 5, 5' and interfacial connections 4, 4' prior to the application of the mask foils 7, 7' and instead is left on the intermediate product V and where the photoresist 3, 3' is deliberately back-etched in areas 14, 14' in the plasma etching step. The thus back-etched areas 14, 14' form local weak points of the plated on contact layer 11 in the peel-off areas between the intermediate product V and the mask foils 7, 7'. The back-etchings in the photoresist 3, 3' are locally plated on with metal in planned manner, which on the one hand leads to good, strong, stable connecting areas 16, 16' of the interfacial connections 12 to the pads L and the current paths SP and on the other only local weak points 17, 17' of the interfacial connections 12 with the mask foils 7, 7' are formed, so that the latter, even when applying thicker contact layers 11 with thicknesses greater than 10 µm, can be removed in the vicinity of the interfacial connections 12 without damaging the intermediate product V.

These local weak points 17, 17' are formed during the plating on of the back-etched photoresist 3, 3' in the interfacial connection openings 12. Due to the fact that the back-etched photoresist 3, 3' is at the end of the back-etched areas 14, 14' (i.e. they are narrow gaps), in this process step only small amounts of chemicals and liquids penetrate the narrow, backetched area 14, 14' and during the chemical and galvanic coating electrically conductive material such as metal is preferably deposited on the conductor layers 1, 1' and the metallic mask foils 7, 7', only a small amount of metal is deposited on the photoresist 3, 3', so that here local, thin contact layers 11 are formed and represent local weak points 17, 17' in the critical peel-off area.

The further embodiment of local weak points 17, 17' in the peel-off area according to FIG. 27 shows a foil circuit board manufactured according to the variant of the process of the invention according to FIGS. 1 to 8 or 18 to 25. In the second embodiment local weak points 17, 17' result from special, advantageous shapes of the through openings 8, 8' of the mask foils 7, 7'. The mask foils 7, 7' according to FIG. 27 have through openings 8, 8' with shapes 20, 20', which following the application thereof to the intermediate product V, form narrow cavities in the vicinity of the connection between the product V and the foils 7, 7'. In these narrow cavities formed by the shapes 20, 20', electrically conductive material is deposited in locally planned manner in order in this way to produce local weak points 17, 17' of the chemically and galvanically deposited contact layer 11 in the peel-off areas between the intermediate product V and the mask foils 7, 7'. Here again there are various possibilities for depositing, e.g. metal. Firstly local thin contact layers 11 are formed in said cavities, because a small amount of chemicals and liquids can penetrate those narrow cavities, so that only thin contact layers 11 form, which represent local weak points 17, 17' in the critical peel-off area. Secondly there is no need for chemical and galvanic deposition (as in the variant according to FIGS. 1 to 8) and instead metal for forming the mask layers 11 can be deposited purely chemically (as in the variant according to FIGS. 18 to 25). In this case, as a result of the chemical potential differences between the materials used, there is a locally planned deposition of metal. This is described in the variant according to FIGS. 18 to 25.

FIGS. 28 to 32 show another variant of the process according to the invention with mechanical structuring of coverings on part of a foil circuit board and this takes in a section along the flat extension of said board.

Figure 28:
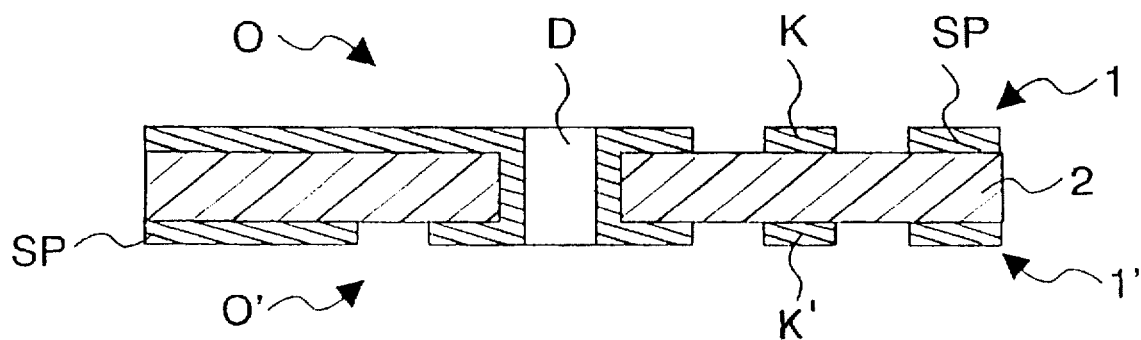
FIGS. 28 to 32 Another variant of the process according to the invention with mechanical structuring of coverings on part of a foil circuit board.

FIG. 28 shows a two-layer foil circuit board comprising current paths SP and contact points K, K', insulated electrically from one another by an insulator layer 2, arranged in two layers of electrically conductive coatings or conductor layers 1, 1'. The two surfaces with flat extension of the foil circuit board are called surfaces O, O'. The current paths SP of different conductor layers 1, 1' can be electrically contacted with one another by interfacial connections D. The aim of the application of a structured covering is to keep the contact points K, K' of the circuit board free from any covering, so as to be able to subsequently load the same with components, whereas for example the current paths SP and insulating surface areas of the insulating layer 2 are to be covered, so as to protect them from mechanical damage or corrosion of metallic current paths.

Figure 29:
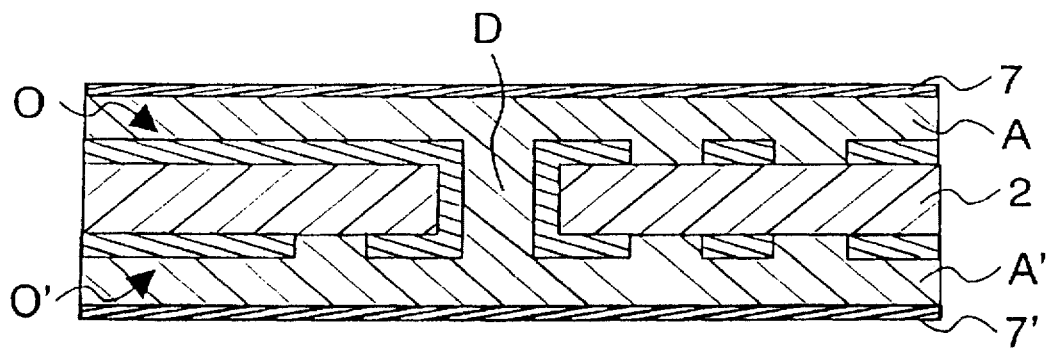

FIG. 29 shows how it is possible to apply to the surfaces O, O' of such foil circuit boards coverings formed from cover layers A, A' and mask foils 7, 7' The cover layers A, A' can comprise polyimide or epoxy films, as well as epoxy resin-coated polyimide films. The latter are for example used in order to connect polyimide films by means of coatings of uncured epoxy resin to mask foils 7, 7' or foil conductor boards, etc. The mask foils 7, 7' are for example of copper, stainless steel, brass, bronze, aluminum-magnesium alloys, invar, molybdenum, etc..

Such epoxy resin-coated polyimide films, along their flat extension, can be laminated on one side with copper foils and on the other side can be laminated on foil circuit boards. This advantageously takes place in the same lamination process under pressure and elevated temperature. These materials are still very flexible after the curing of the epoxy resin and are therefore generally usable as coverings for flexible circuit supports.

They are inexpensive, so that the process can be inexpensively performed. Cover layers A, A' can be simultaneously laminated onto both sides of the foil circuit board, which is not possible in most of the aforementioned processes using solder resists. The latter must be applied on one side and dried before the second side can be treated (one exception to this is the expensive electrophoretic process).

The interfacial connections D of the foil circuit board are filled during lamination with e.g. epoxy resin-coated polyimide films, so that said conductors are protected. The thicknesses of such copper foils and epoxy resin-coated polyimide films are below 10 μm.

Figure 30:
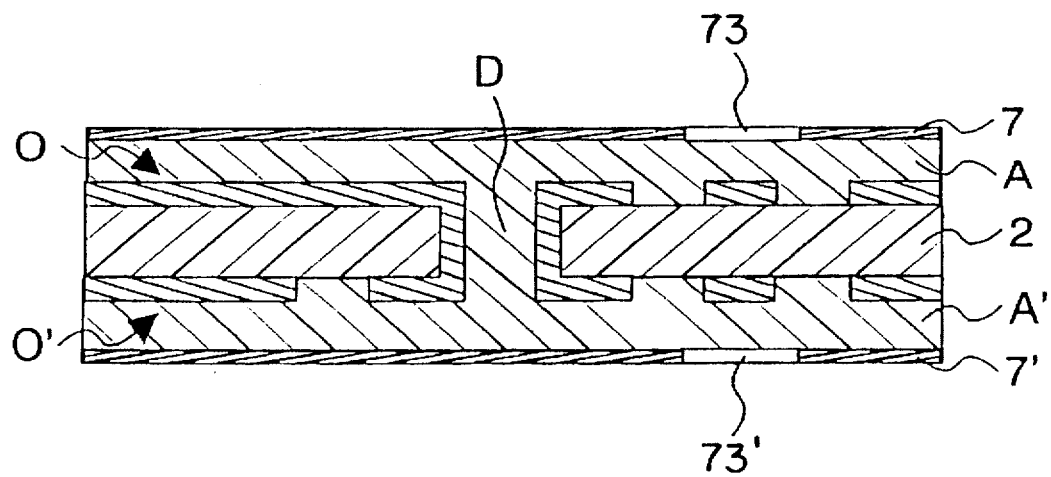

FIG. 30 shows the mask foils 7, 7' according to FIG. 29 applied to the cover layers A, A' and the foil circuit board following the photochemical structuring of the foils 7, 7' in contacting structures 73, 73'. This takes place using known photochemical processes, the contacting structures 73, 73' being transferred in accordance with a photomask into the mask foils 7, 7'. The contacting structures 73, 73' extend down to the cover layers A, A'. Therefore mask material-free (copper-free) areas are formed on the cover layers A, A'. The shape of said contacting structures 73, 73' are freely selectable and can for example have circular cylindrical, round, oval, square, rectangular or polygonal diameters.

Figure 31:
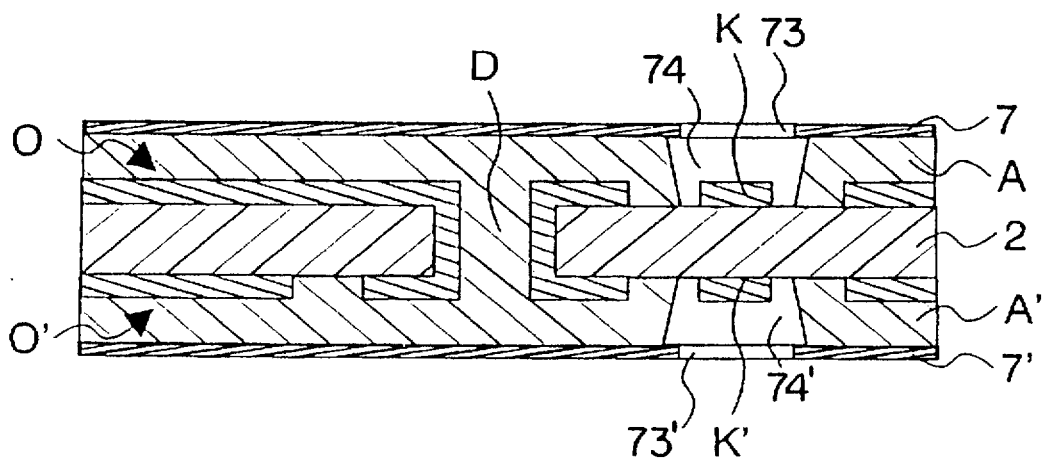

FIG. 31 shows the mask foils 7, 7' according to FIG. 30 applied to the foil circuit board following the mechanical structuring of the cover layers A, A' in resist openings 74, 74'. The latter are etched in a plasma etching process in the copper-unprotected areas, in accordance with the contacting structures 73, 73' of the mask foils 7, 7'. Otherwise the mask foils 7, 7' protect the cover layers A, A' against plasma action, so that there is no etching of the cover layers A, A' at this point. The edges of the contacting structures 73, 73' of the mask foils 7, 7' are back-etched and the resist openings 74, 74' have sloping walls.

The resist openings 74, 74' in the cover layers A, A' are plasma-etched down to the surfaces O, O' of the foil circuit board. All these contacting structures 73, 73' of the mask foils 7, 7' are simultaneously etched in the plasma etching process. Plasma etching is a known, proven process and the back-etchings and the depth of the etchings can be precisely regulated and controlled by the expert by means of the etching parameters such as the gas pressure, etching time, etc. Plasma etching is an environmentally friendly process, which leads to no contamination of the waste waters or sewage, which would then have to be treated and there are no residues requiring special disposal.

As a result the contact points K, K' of the surfaces O, O' of the foil circuit board are exposed, whereas the current paths SP and insulating surface areas of the insulator layer 2 remain covered by the cover layers A, A'. Therefore the aforementioned aims of said first embodiment of a structured covering for a foil circuit board are fulfilled.

Figure 32:
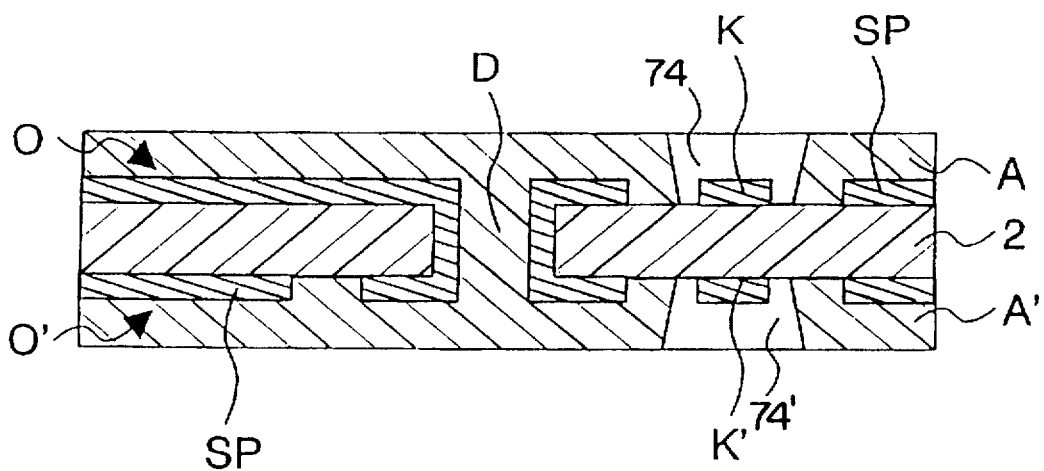

FIG. 32 shows the foil circuit board provided with a covering structured according to FIG. 31 after removing the mask foils 7, 7'. This can take place by wet chemical etching. In this process step naturally also exposed areas of the foil circuit board, such as the contact points K, K' are chemically etched. However, the mask foils 7, 7' can also be worked very thin (3 to 5 μm thick), so that they represent less than 20% of the thickness of the contact points K, K', so that for identical etching rates of the mask materials and contact point materials, the material loss at the contact points K, K' represents less than 20%, while the mask foils 7, 7' are removed. This etching away of less than 20% of the thicknesses of the exposed areas of the foil circuit board, such as contact points can be accepted. This wet chemical etching is a known, proven process and can be well controlled by the expert.

Etching rates on such exposed contact points K, K' and mask foils 7, 7' can also differ. For example, the contact points K, K' can be provided with etching delaying or protecting means such as thin nickel coatings or chemically deposited gold coatings or can entirely comprise such conductors, so that contact points K, K' treated in this way during the wet etching of the mask foils 7, 7' may be attacked by less than 20% or not at all. The application of nickel or gold coatings to the contact points K, K' advantageously takes place prior to the application of the covering to the foil circuit board according to FIG. 29.

The structured mask foils 7, 7' do not have to be removed from the structured cover layers A, A' and can be left thereon and used as passive electrical elements. Thus, uses as electromagnetic shielding surfaces are appropriate, e.g. to shield against high frequency radiation, which can interfere with the operation of the electronic circuit of the foil circuit board. With a corresponding thickness of the mask foils 7, 7' the structured mask foils 7, 7' can also be used as voltage supplies or as earth leads for the foil circuit board. The corresponding configurations of the thicknesses of the mask foils 7, 7', the possibly necessary fitting of electrical connections between the mask foils 7, 7' and the foil circuit board can all the implemented by the expert with the knowledge of the present invention.

Figure 33:
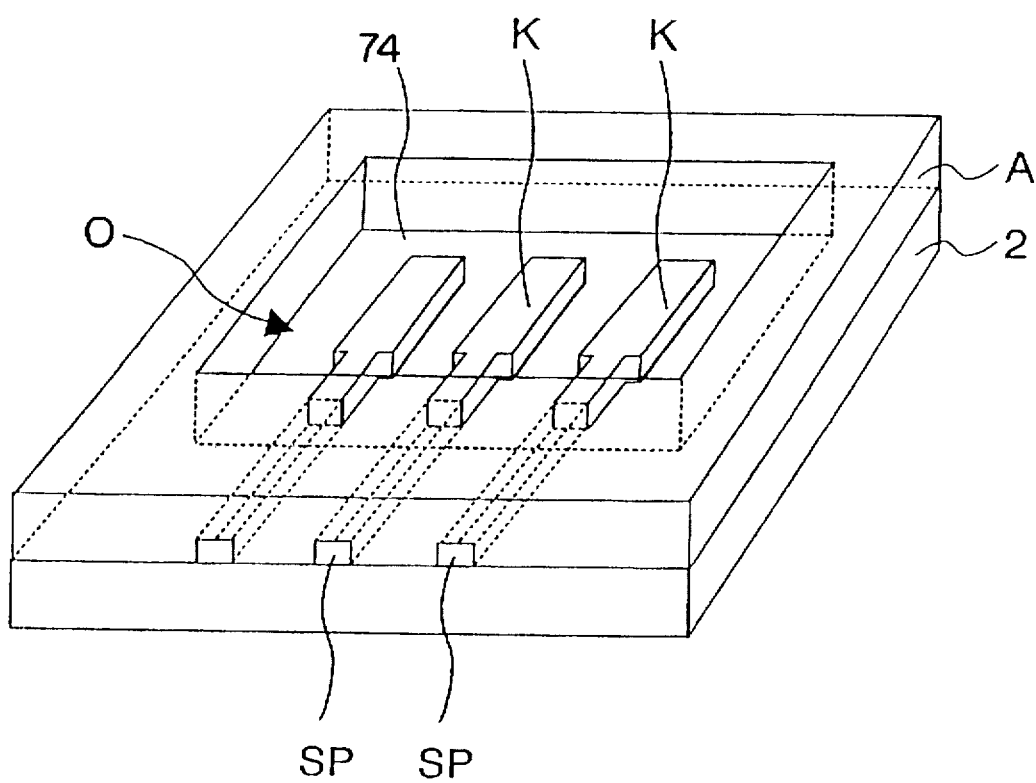
FIG. 33 In a perspective view part of an exemplified embodiment of a foil circuit board with a covering structured by the process according to the invention.

FIG. 33 perspectively shows part of the surface O of an embodiment of a foil printed circuit board with a covering structured by the process according to the invention. The foil circuit board is partly covered by the structured cover layer A. The current paths SP are protected by for example a polyimide layer of the cover layer A against harmful environmental influences, whereas the contact point K is accessible in a rectangular resist opening 4, which can be subsequently used for loading with components, for wire bonding, etc..

FIGS. 34 to 37 show another variant of the process according to the invention with mechanical structuring of coverings on part of a foil circuit board. This takes place in a section along the flat extension of the circuit board. The process sequence of this variant largely follows the variant described relative to FIGS. 28 to 32, so that only the differences will be explained hereinafter.

The main difference between these variants of the process of the invention is that in the variant of FIGS. 34 to 37 the mask foils 7, 7' are not irreversibly connected to the cover layers A, A' and instead reversibly fittable foils 7, 7' are used. They are provided with contacting structures 73, 73' and constitute reutilizable resources.

Figure 34:
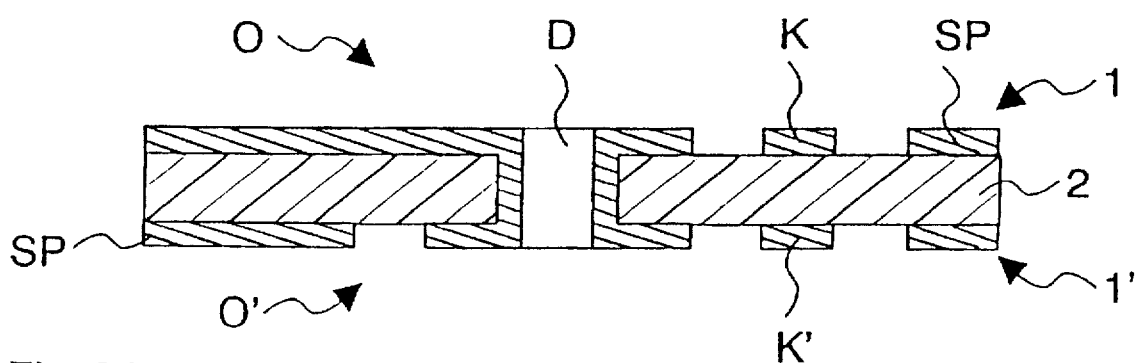
FIGS. 34 to 37 A further variant of the process according to the invention with mechanical structuring of coverings on part of a foil circuit board.

FIG. 34 shows an exemplified structurable two-layer foil circuit board to be covered, precisely as in FIG. 28.

Figure 35:
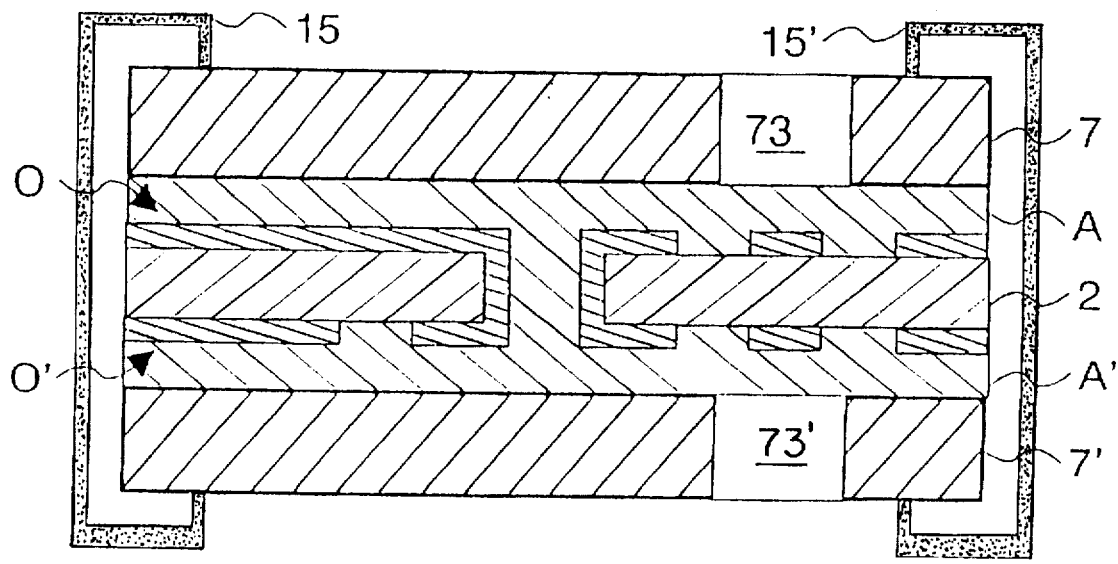

FIG. 35 shows how coverings comprising cover layers A, A' and mask foils 7, 7' are applied to the surfaces O, O' of the foil circuit board. In this variant the cover layers A, A' comprise polyimide films coated with uncured epoxy resin on only one side, e.g. along the flat extension thereof and which are irreversibly connected by means of said epoxy resin to the surfaces O, O' of the circuit board in a lamination process. The thicknesses of said epoxy resincoated polyimide films are below 100 μm. However the mask foils 7, 7' are reversibly connected to the cover layers A, A'. The mask foils 7, 7' are e.g. made from stainless steel and have thicknesses below 100 μm. They are fixed with holding means such as e.g. clips 15, 15' and can be removed from the mask foils again e.g. by detaching the clips. Fixing consists of tight pressing. The positioning of the mask foils 7, 7' takes place in known manner, e.g. by registering bolts. Thus, on the foil circuit board and mask foils 7, 7' are made specially shaped markings, which can e.g. be made to coincide, so that there is a controlled positioning thereof. Due to the fact that the mask foils 7, 7' are removed again from the resist openings 74, 74' after plasma etching and are not, as in the first variant, destroyed or left thereon, they constitute reutilizable resources.

The mask foils 7, 7' are structured by contour etching and have contacting structures 73, 73'. Therefore, prior to their application to the cover layers A, A', the mask foils 7, 7' are photochemically structured in contacting structures 73, 73'. For example, the contacting structures 73, 73' are transferred in accordance with a photomask to the mask foils 7, 7', after which the contacting structures 73, 73' are wet etched through the foils 7, 7', so that following the application of the foils 7, 7' to the cover layers A, A' the structures 73, 73' form mask material-free areas on the coatings A, A'. It is possible to produce contacting structures 73, 73' having random shapes and structures, such as round, angular, elongated straight and curved openings, etc..

Figure 36:
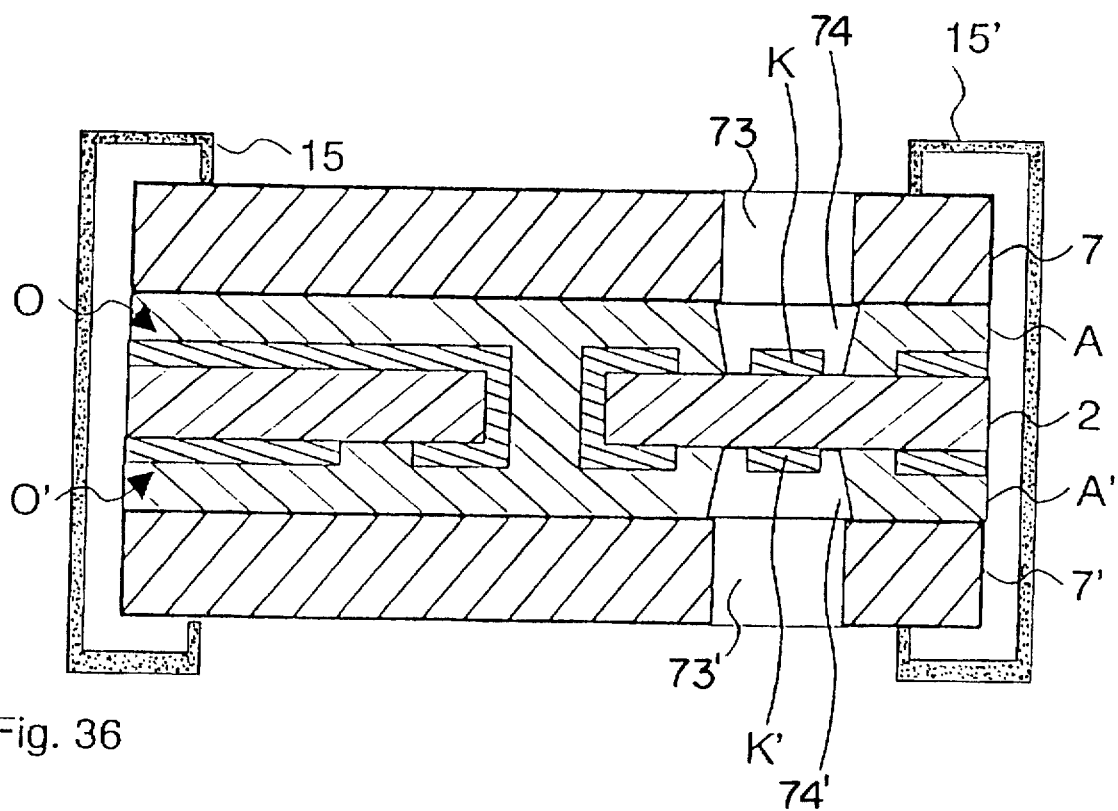

FIG. 36 shows the mask foils 7, 7' according to FIG. 35 applied to the foil circuit board following the mechanical structuring of the cover layers A, A' in resist openings 4, 4'. These resist openings 4, 4' are etched in a plasma etching process in the copper-unprotected areas, in accordance with the contacting structures 73, 73' of the mask foils 7, 7'. Otherwise the mask foils 7, 7' protect the cover layers A, A' against plasma action, so that at this point there is no etching of the coatings A, A'. The edges of the contacting structures 73, 73' of the mask foils 7, 7' are back-etched and the resist openings 74, 74' have sloping walls. The resist openings 74, 74' in the cover layers A, A' are plasma etched down to the foil circuit board surfaces O, O'. As a result the contact points K, K' of the circuit board surfaces O, O' are exposed, whereas e.g. the current paths SP and insulating surface areas of the insulator layer 2 remain covered by the cover layers A, A'.

Figure 37:
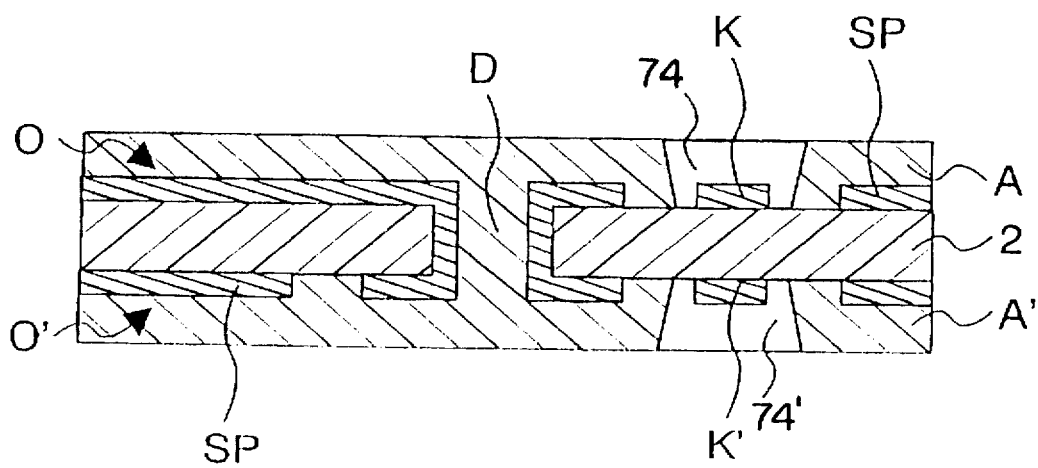

FIG. 37 shows the foil circuit board provided with a covering structured according to FIG. 36 after removing the mask foils 7, 7' and the covered coil circuit board F structured according to the inventive process is identical with that according to FIG. 32.

The multilayer printed circuit boards and foil printed circuit boards manufactured according to the process of the invention consequently have structured coverings with resist openings 74, 74', which form covering material-free areas on the circuit boards and foil circuit boards, said openings 74, 74' being worked in freely shaped manner and have circular cylindrical, round, oval, square, rectangular or polygonal diameters, said openings 74, 74' forming structures with sharply contoured edges, whose definition is smaller than 100 μm, which are flexible and do not chip off when flexible circuit carriers or supports are bent.

We claim:

1. A process for manufacturing multilayer foil printed circuit boards, comprising the steps of providing a laminate including an electrically insulating layer of plastic film having electrically conductive layers on opposite surfaces of the film, each electrically conductive layer having an exposed surface facing away from the film, coating the exposed surfaces with layers of a photoresist material, photochemically removing selected areas of the photoresist material to expose surface areas of the conductive layers in desired patterns including selected locations for interfacial electrical connections, etching the laminate to remove the conductive layers at the exposed surface areas to form patterned openings through the conductive layers, providing first and second mechanical mask foils having openings therethrough at the selected locations for interfacial connections, applying the mechanical mask foils to opposite surfaces of the laminate and holding the foils against the laminate with openings therethrough aligned with the selected locations for interfacial connections, etching openings through the plastic film, and adding electrically conductive material in the openings by plating to form interfacial connections.

2. The process according to claim 1 wherein the step of applying comprises removably applying the foils and wherein, after the step of plating, the foils are removed.

3. The process according to claim 1 wherein the step of applying comprises non-removably applying the foils.

4. The process according to claim 1 wherein the desired patterns of the conductive layers include conductive locations for subsequent contact points, the method including, after the step of adding conductive material, removing the mask foils, covering the laminate surfaces with cover layers of electrically non-conductive material, applying a second set of mask foils to the cover layers of non-conductive material, forming an opening through at least one mask foil of the second set of mask foils aligned with a contact point, and removing a portion of at least one of the cover layers of electrically non-conductive material to expose the contact point while leaving a protective covering over other conductive pattern portions.

5. The process according to claim 4 wherein the cover layers of electrically non-conductive material comprise polyimide films coated on one side with uncured epoxy resin, the process comprising non-removably connecting the cover layers by the epoxy resin to opposite surfaces of the laminate.

6. The process according to claim 5 and including, before the step of applying the mechanical mask foils, the steps of transferring with a photomask to the mechanical mask foils the desired patterns of removed conductive material for contacting structures, and wet-etching the mask foils so that the foils have openings therethrough in the locations for contacting structures, whereby contacting structures are exposed.

7. The process according to claim 4 wherein the cover layers of electrically non-conductive material comprise polyimide films coated on both sides with uncured epoxy resin, the process comprising non-removably connecting one side of each cover layer by the epoxy resin to a surface of the laminate and non-removably connecting the other side of the cover layer to a mechanical mask foil.

8. The process according to claim 7 including, after the step of applying the mechanical mask foils to the cover layers, the steps of transferring with a photomask to the mechanical mask foils the desired patterns of removed conductive material for contacting structures, and wet-etching the mask foils so that the foils have openings therethrough in the locations for contacting structures, and wet-etching the cover layers to the contact structures whereby contacting structures are exposed.

9. The process according to claim 8 wherein openings formed through the cover layers have freely selectable shapes.

10. The process according to claim 4 wherein the step of applying includes removably applying the mechanical mask foils to the opposite surfaces using mechanical clips so that the clips press the mechanical mask foils tightly to the surfaces, positioning the mechanical mask foils in a desired position defined by markings thereon using alignment bolts, and subsequently removing the mechanical mask foils by removing the clips.

11. The process according to claim 10 wherein the mechanical mask foils are reusable.

12. The process according to claim 11 wherein, after mechanical structuring, etching away the mechanical mask foils.

13. The process according to claim 12 wherein said mechanical mask foils have thicknesses of less than 20% of the thicknesses of contact points formed on said laminates and said contact points and mechanical mask foils are made of materials having the same etching rates whereby, in the step of etching away, less than 20% of the thickness of the contact points is etched away.

14. The process according to claim 12 wherein said contact points and mechanical mask foils are made of materials having different etching rates and wherein, in the step of etching away, less than 20% of the thickness of the contact points is etched away.

15. The process according to claim 1 and including leaving the mechanical mask foils as part of the structure.

16. The process according to claim 1 wherein the step of adding electrically conductive material includes depositing conductive material in the openings, further including subsequently removing the mechanical mask foils.

17. The process according to claim 16 wherein the step of applying the mechanical mask foils includes pressing the mechanical mask foils to the laminate with clips.

18. The process according to claim 17 wherein the mechanical mask foils have a concave shape, facing away from the laminate, before applying and are pressed against the laminate under bending stress.

19. The process according to claim 18 wherein the desired patterns in the conductive layers include current paths and pads.

20. The process according to claim 19 wherein the interfacial connection are formed at locations of said pads and are dimensioned to be surrounded by said pads.

21. The process according to claim 20 wherein the external diameters of the openings through the mechanical mask foils at the locations for interfacial connections are smaller than the external diameters of the pads (L) and larger than the external diameters of the openings etched through the plastic film, the openings through the mask foils being equal to the external diameter of a pad(L) minus the diameter of a through opening divided by two.

22. The process according to claim 21 wherein the photochemical structuring of current paths, pads and interfacial connection openings takes place in a single step.

23. The process according to claim 1 wherein, in the step of adding electrically conductive material, thicknesses of material less than 10 μm are added whereby weak connections between mechanical mask foils and the laminate are formed, allowing damage-free detachment of the foil from the laminate.

24. The process according to claim 1 wherein, after the step of adding electrically conductive material, the laminate is back-etched producing the formation of weak connections between mechanical mask foils and the laminate, thereby allowing damage-free detachment of the foils from the laminate.

* * * * *

UNITED STATES PATENT AND TRADEMARK OFFICE
CERTIFICATE OF CORRECTION

PATENT NO. : 5,729,897
DATED : March 24, 1998
INVENTOR(S) : Walter Schmidt and Marco Martinelli It is certified that error appears in the above-indentified patent and that said Letters Patent is hereby corrected as shown below:

On the title page;

After [75] the identification of the inventors should read as follows:

Walter Schmidt, Zürich; Marco Martinelli, Neftenbach, both of Switzerland

After [73] the identification of the assignee should read as follows:

Dyconex Patente AG, Zug, Switzerland

Signed and Sealed this

Twenty-fifth Day of August, 1998

Attest:

BRUCE LEHMAN

*Attesting Officer*     *Commissioner of Patents and Trademarks*